(12) United States Patent
Jiang et al.

(10) Patent No.: US 9,741,597 B2
(45) Date of Patent: Aug. 22, 2017

(54) POSITIONING DEVICE FOR GLASS SUBSTRATE

(71) Applicant: SHENZHEN CHINA STAR OPTOELECTRONICS TECHNOLOGY CO., LTD., Shenzhen, Guangdong (CN)

(72) Inventors: Yunshao Jiang, Guangdong (CN); Kun Hsien Lin, Guangdong (CN); Yongqiang Wang, Guangdong (CN); Minghu Qi, Guangdong (CN); Zenghong Chen, Guangdong (CN); Weibing Yang, Guangdong (CN); Zhiyou Shu, Guangdong (CN); Guokun Yang, Guangdong (CN); Chenyangzi Li, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 52 days.

(21) Appl. No.: 14/113,747

(22) PCT Filed: Jul. 22, 2013

(86) PCT No.: PCT/CN2013/079795
§ 371 (c)(1),
(2) Date: Oct. 24, 2013

(87) PCT Pub. No.: WO2015/006988
PCT Pub. Date: Jan. 22, 2015

(65) Prior Publication Data
US 2017/0186640 A1 Jun. 29, 2017

(30) Foreign Application Priority Data

Jul. 16, 2013 (CN) .......................... 2013 1 0298333

(51) Int. Cl.
*H01L 21/677* (2006.01)
*H01L 21/687* (2006.01)
*H01L 21/68* (2006.01)

(52) U.S. Cl.
CPC ........ *H01L 21/67796* (2013.01); *H01L 21/68* (2013.01); *H01L 21/68721* (2013.01); *H01L 21/68728* (2013.01)

(58) Field of Classification Search
CPC ....... B23P 19/00; B23P 19/006; B23P 19/008; B23P 19/04; B23P 19/10
See application file for complete search history.

(56) References Cited

U.S. PATENT DOCUMENTS 5,163,651 A * 11/1992 Matsumoto .............. B23Q 1/38
108/20
6,262,582 B1 * 7/2001 Barringer ........... G01R 31/2887
269/254 CS (Continued)

FOREIGN PATENT DOCUMENTS

CN           2776925 Y      5/2006
CN         101306521 A     11/2008

(Continued)

OTHER PUBLICATIONS

Yongchao Dai, the International Searching Authority written comments, Apr. 2014, CN.

*Primary Examiner* — Lee D Wilson

(57) ABSTRACT

The present invention provides a positioning device configured to position a glass substrate. The positioning device comprises a support base, a pair of first positioning mechanisms located on two neighboring sides of the glass substrate, a pair of second positioning mechanisms located on another two neighboring sides of the glass substrate, respectively, a pair of connecting bars, a driving member, a gear group and a conveying belt sleeved on the gear group. One end of the one of the pair of connecting bar is fixed with the conveying belt, and another end is fixed with one of the pair of first positioning mechanisms. One end of another one of the pair of connecting bar is fixed with the conveying belt, (Continued)

and another end is fixed with another one of the pair of first positioning mechanisms.

20 Claims, 4 Drawing Sheets

(56) References Cited

U.S. PATENT DOCUMENTS

| | | | | |
|---|---|---|---|---|
| 6,299,153 | B1* | 10/2001 | Meron | H01L 21/68728 269/128 |
| 6,328,296 | B2* | 12/2001 | Tyveleijn | H01L 21/68728 269/287 |
| 6,536,755 | B2* | 3/2003 | Meron | H01L 21/68728 269/128 |
| 7,422,202 | B2* | 9/2008 | Wu | G02B 27/62 269/291 |
| 2015/0068456 | A1* | 3/2015 | Kuriyama | C23C 14/042 118/505 |

FOREIGN PATENT DOCUMENTS

| | | |
|---|---|---|
| CN | 102126612 A | 7/2011 |
| CN | 102134004 A | 7/2011 |
| CN | 201910439 U | 7/2011 |
| CN | 102180348 A | 9/2011 |
| CN | 103034064 A | 4/2013 |
| JP | 2002359275 A | 12/2002 |
| JP | 2005116878 A | 4/2005 |
| JP | 3702754 B2 | 10/2005 |

* cited by examiner

POSITIONING DEVICE FOR GLASS SUBSTRATE

FIELD OF THE INVENTION

The present invention relates to mechanical field, and more particularly to a positioning device for a glass substrate.

BACKGROUND OF THE INVENTION

Typically, a glass substrate of a thin film transistor -liquid crystal display (TFT-LCD) is transferred by a robot in an automated production line of an LCD manufacturing facility. This transfer method is simple and easy to control, but the transmission error is large, especially in fast delivery or long-distance transmission. In an existing production line, the glass substrate is required to be positioned accurately in a machine for special processes, so as to process the glass substrate accurately. However, it is expensive to set a positioning mechanism on the machine, due to complexity of the structure and electronic systems of the machine. Therefore, it brings increase of production cost to set the positioning mechanism on the machine. Furthermore, the positioning effect of the positioning mechanism for the glass substrate is not entirely wishful, which results of reduction of production yield of the TFT-LCD.

SUMMARY OF THE INVENTION

On account of the lack of the prior art, the object of the present invention is to provide a positioning device, configured to position a glass substrate before a special process that requires a accuracy positioning for the glass substrate. The positioning device is configured to reduce transferring error of the glass substrate, and transfer the glass substrate on a machine for the special process accurately.

The present invention provides a positioning device configured to position a glass substrate. The glass substrate comprises two pairs of opposite sides. The positioning device comprises a support base, a pair of first positioning mechanisms, a pair of second positioning mechanisms, a pair of connecting bars, a driving member, a gear group and a conveying belt. The support base is configured to support the glass substrate. The pair of first positioning mechanisms are located on two neighboring sides of the glass substrate, respectively, and configured to move relative to the glass substrate. The pair of second positioning mechanisms are located on another two neighboring sides of the glass substrate, respectively, and near the glass substrate, respectively. The gear group comprises a first gear, a second gear and a third gear. The first gear, the second gear and the third gear are configured in a shape of a triangle. The conveying belt is sleeved on the gear group. One end of the one of the pair of connecting bar is located between the second gear and the third gear and fixed with the conveying belt, and another end of one of the pair of the connecting bar is fixed with one of the pair of first positioning mechanisms. One end of another one of the pair of connecting bar is located between the third gear and the first gear and fixed with the conveying belt, and another end of the other one of the pair of the connecting bar is fixed with another one of the pair of first positioning mechanisms. When the driving member drives the first gear to rotate clockwise, the conveying belt drives the pair of connecting bars moving together with the conveying belt, which results that the pair of first positioning mechanisms move away from the glass substrate to release the glass substrate. When the driving member drives the first gear to rotate counterclockwise, the conveying belt drives the pair of connecting bars moving together with the conveying belt, which results that the pair of first positioning mechanisms move close to the glass substrate. The pair of first positioning mechanisms and the pair of second positioning mechanisms collectively clamp the glass substrate to position the glass substrate.

Perfectly, the triangle is a right triangle, and the pair of connecting bars are located on two right-angle sides of the triangle, respectively.

The pair of connecting bars are fixed with the conveying belt by connecting blocks.

The two right-angle sides of the triangle are parallel to two adjacent side of the glass substrate, respectively.

Each of the pair of first positioning mechanisms comprises a supporting block, at least one pole and at least one guiding wheel. One end of the at least one pole is fixed with the supporting block, another end of the at least one pole is fixed with the at least one guiding wheel. The at least one guiding wheel is configured to clamp the glass substrate.

The material of the guiding wheel is rubber.

The positioning device further comprises two pairs of slideways. One pair of slideways correspond to one of the pair of first positioning mechanisms. Two ends of the supporting block are received in the corresponding slideways, and moves along the slideways to release or clamp the glass substrate.

The positioning device further comprises a transmission shaft, and the driving member is connected to the first gear by the transmission shaft.

The driving member is a motor.

The group of the gears is located under the supporting base.

Compared with the prior art, the positioning device of the present invention provides a gear group driving the conveying belt to move, and positions the glass substrate accurately by coordination with the two pairs of positioning mechanisms. As a result, in an automated production line of a LCD manufacturing facility, the glass substrate is positioned accurately by the positioning device before a special process that requires accuracy position of the glass substrate. Thus, the transmission error of the glass substrate is lowered, and the glass substrate is accurately transferred to a machine in the special process to be machined, which results improvement of a production yield of a TFT-LCD.

DETAILED DESCRIPTION OF THE PREFERRED EMBODIMENTS

Figure 1:
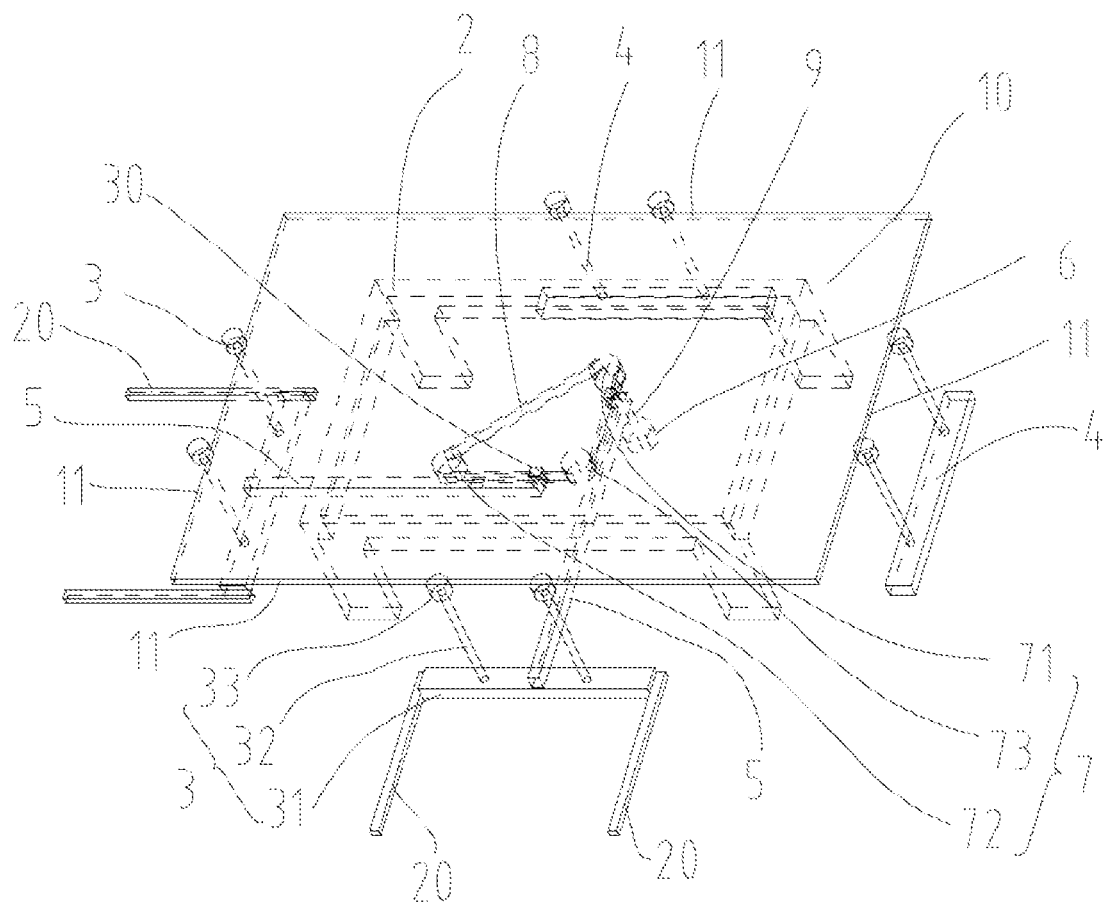
FIG. 1 is a perspective view of a positioning device clamping a glass substrate according to the present invention.
Figure 2:
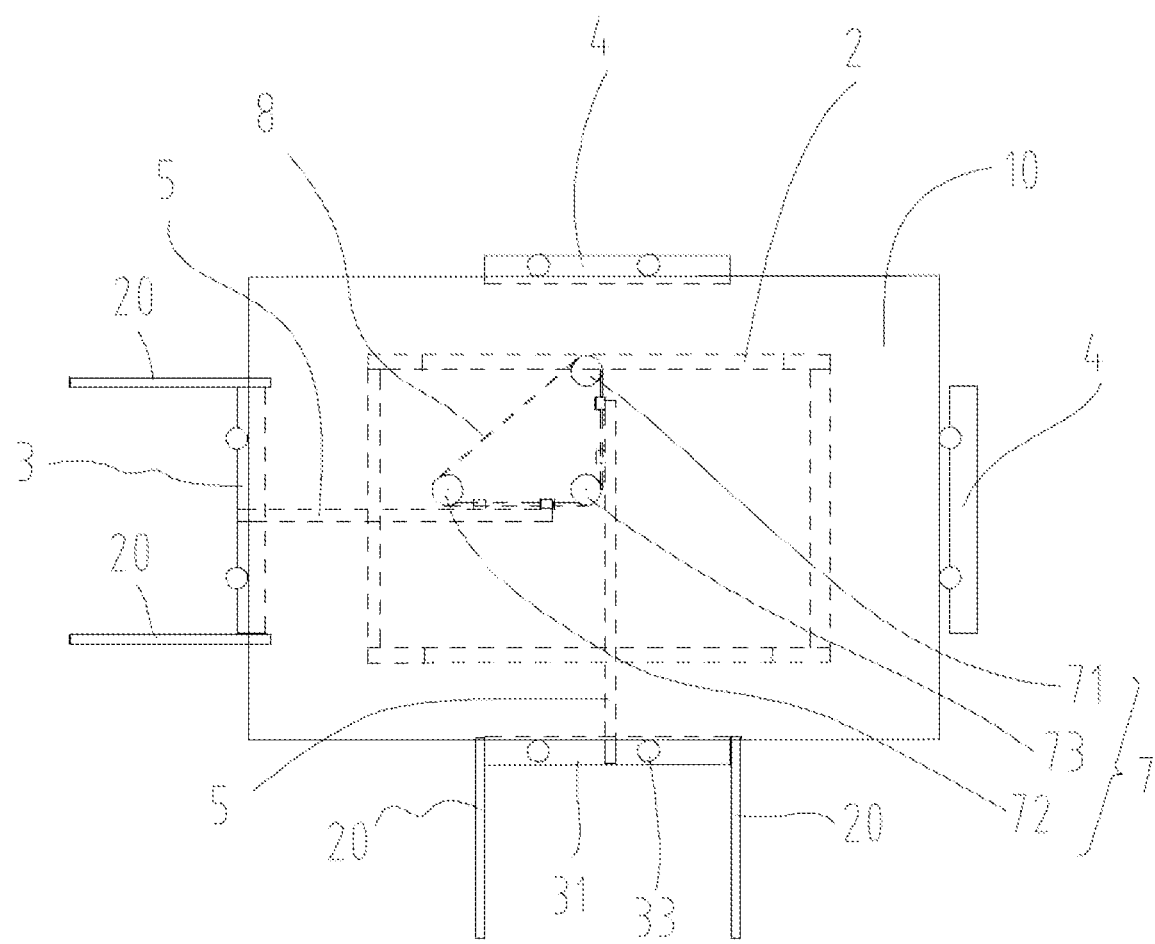
FIG. 2 is a top view of the positioning device for the glass substrate of FIG. 1.

Please refer to FIG. 1 and FIG. 2, the present invention provides a positioning device, configured to position a glass substrate 10. The glass substrate 10 comprises two pairs of opposite sides 11. In this embodiment, the glass substrate 10 is used to manufacture a thin film transistor-liquid crystal display (TFT-LCD).

In the embodiment, the positioning device is configured in an automated production line, and is provided to position the glass substrate 10 of the TFT-LCD before a special process that requires an accuracy position for the glass substrate 10.

The positioning device comprises a supporting base 2, a pair of first positioning mechanisms 3, a pair of second positioning mechanisms 4, a pair of connecting bars 5, a driving member 6, a gear group 7 and a conveying belt 8.

The supporting base 2 is configured for supporting the glass substrate 10. The pair of first positioning mechanisms 3 are located on two neighboring sides 11 of the two pairs of opposite sides 11 of the glass substrate 10, respectively, and are capable of moving relative to the glass substrate 10. The pair of second positioning mechanisms 4 are located at the other two neighboring sides 11 of the two pairs of opposite sides 11 of the glass substrate 10, respectively, and near the glass substrate 10.

The gear group 7 comprises a first gear 71, a second gear 72 and a third gear 73. The first gear 71, the second gear 72 and the third gear 73 are configured in a shape of a triangle. The conveying belt 8 is sleeved on the gear group 7. One end of one of the pair of connecting bars 5 is located between the second gear 72 and the third gear 73, and is fixed with the conveying belt 8. Another end of the one of the pair of connecting bars 5 is fixed with one of the pair of first positioning mechanisms 3. One end of another one of the pair of connecting bars 5 is located between the third gear 73 and the first gear 71, and is fixed with the conveying belt 8. Another end of the other one of the pair of connecting bars 5 is fixed with another one of the pair of first mechanisms 3.

When the driving member 6 drives the first gear 7 to rotate clockwise, the conveying belt 8 drives the pair of connecting bars 5 to move together with the conveying belt 8. The pair of first positioning mechanisms 3 moves away from the supporting base 2 to release the glass substrate 10, as shown in FIG. 1 and FIG. 2

Figure 3:
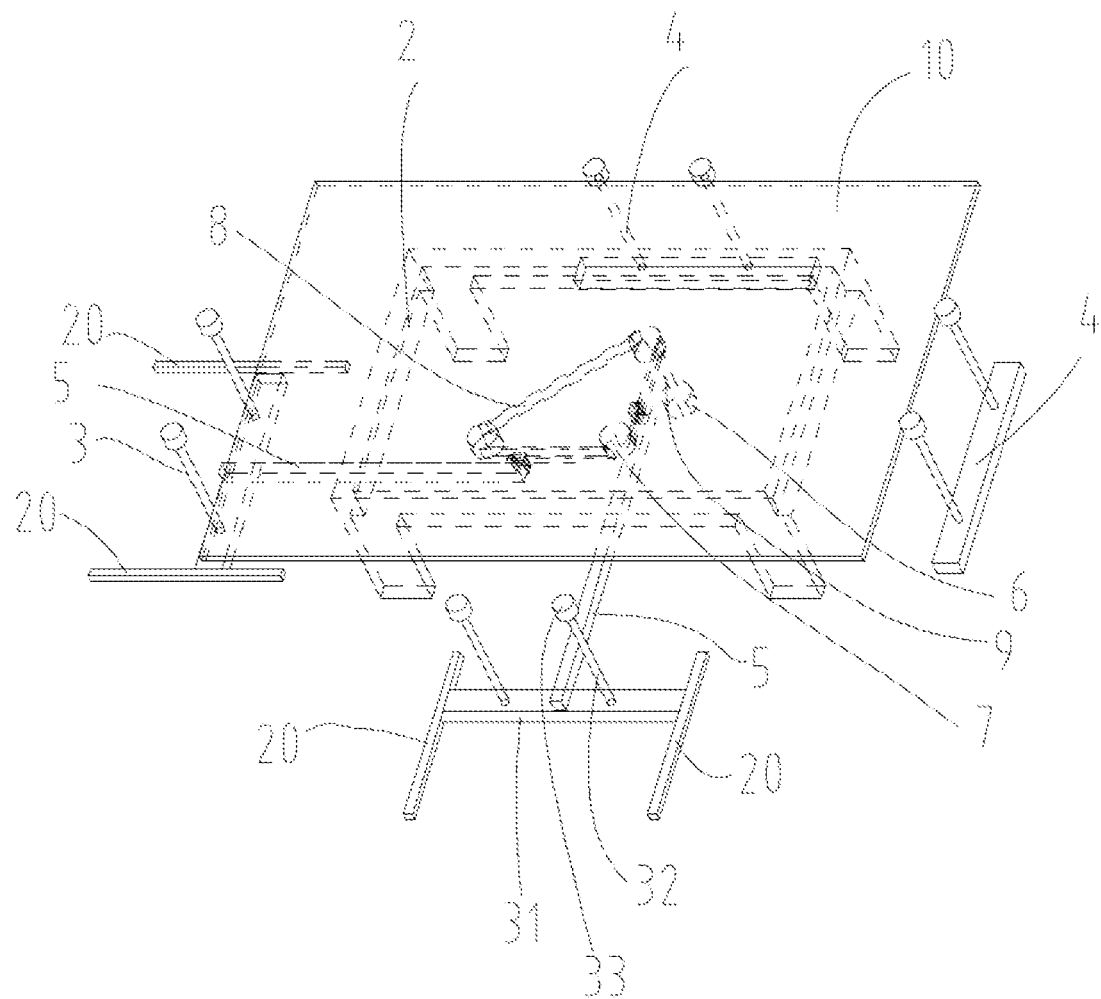
FIG. 3 is a perspective view of the positioning device releasing the glass substrate according to the present invention.
Figure 4:
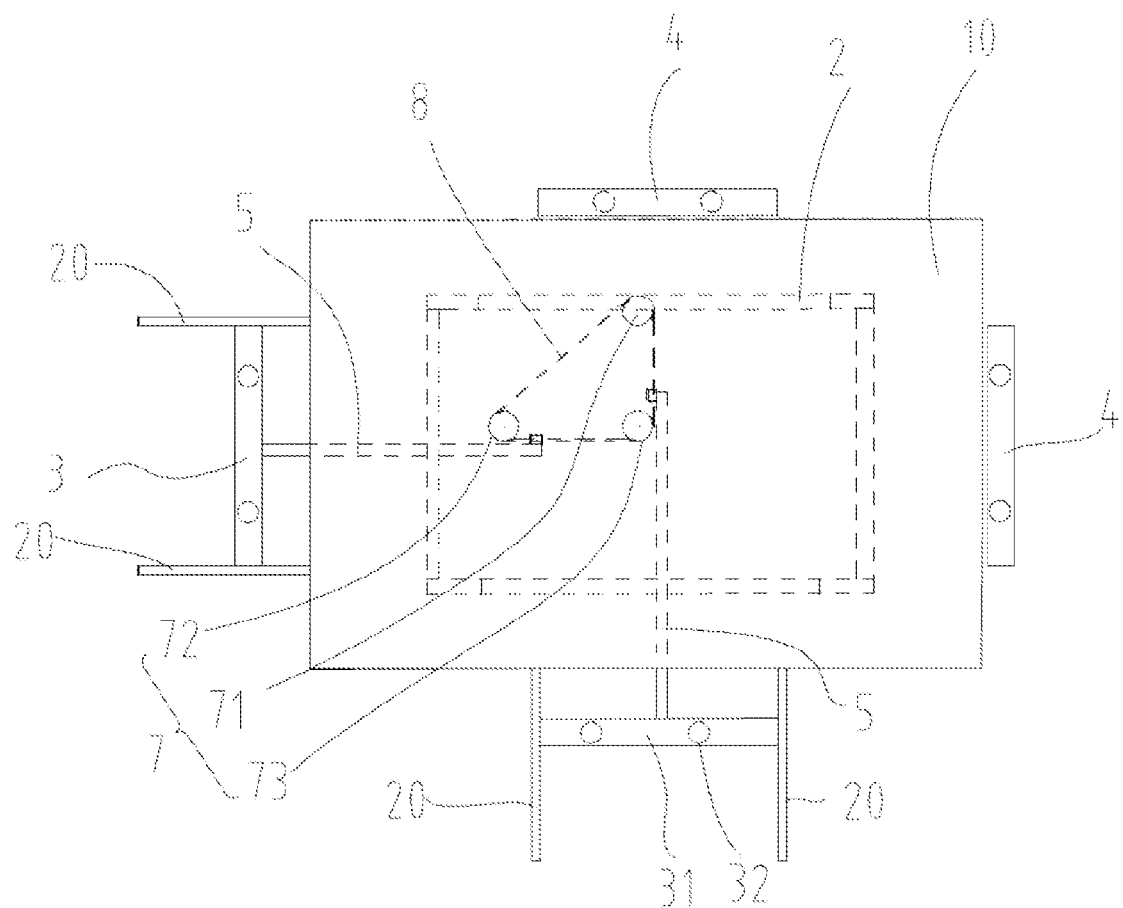
FIG. 4 is a top view of the positioning device for the glass substrate of FIG. 3.

When the driving member 6 drives the first gear 71 to rotate counterclockwise, the conveying belt 8 drives the pair of connecting bars 5 to move together with the conveying belt 8. The pair of first positioning mechanisms 3 moves close to the supporting base 2, and the pair of first mechanisms and the pair of second mechanisms collectively clamp the glass substrate 10 to position the glass substrate 10, as shown in FIG. 3 and FIG. 4

Thus, the positioning device of the present invention provides a gear group 7 driving the conveying belt 8 to move, and positions the glass substrate 10 accurately by coordination with the two pairs of positioning mechanisms 3,4. As a result, in an automated production line of a LCD manufacturing facility, the glass substrate is positioned accurately by the positioning device before a special process that requires accuracy position of the glass substrate. As a result, the transmission error of the glass substrate is lowered, and the glass substrate is accurately transferred to a machine in the special process to be machined, which results improvement of a production yield of a TFT-LCD.

In addition, because the pair of second positioning mechanism 4 are static relative to the glass substrate 10, and the pair of first positioning mechanism 3 are capable of moving relative to the glass substrate 10, the positioning device can clamp and position various glass substrates with different sizes. Furthermore, the structure of the positioning device is simple, in a low purchase cost, and saving space of a cleanroom, which results in a low cost of the LCD production.

Further, the group of gears 7 is configured in a shape of a right triangle, and the pair of connecting bars 5 are located at the two right-angle sides of the right triangle, respectively.

In this embodiment, the pair of connecting bars 5 are fixed with the conveying belt 8 by connecting blocks 30. In other embodiment, the pair of connecting bars can be fixed with the conveying belt 8 by way of sticking.

In the embodiment, the group of gears 7 are located under the supporting base 2.

In other embodiment, the group of gears 7 are located in a gear box.

Thus, the present embodiment provides the positioning device with the driving member and the positioning mechanisms both located under the supporting base 2, which results of reduction of occupying area of the positioning mechanisms, and saving space of the cleanroom.

In detail, each of the pair of first positioning mechanisms 3 comprises a supporting block 31, at least one pole 32 and at least one guiding wheel 33. One end of the pole 32 is fixed with the supporting block 31, and another end of the pole 32 is fixed with the guiding wheel 33. The guiding wheel 33 is configured for clamping the glass substrate 10.

In the embodiment, the structure of the pair of second positioning mechanisms 4 are same as that of the pair of first positioning mechanisms 3, so that the structure of the pair of second positioning mechanisms 4 are omitted in this description.

In the embodiment, the material of the guiding wheel 33 is rubber.

Further, the positioning device further comprises two pairs of slideways 20. One pair of slideways 20 correspond to one of the pair of first positioning mechanisms 3. In assembly, two ends of the supporting block 31 are received in the corresponding slideways 20, and moves along the slideways 20 to release or clamp the glass substrate 10.

Further, the positioning device further comprises a transmission shaft 9, and the driving member 6 is connected to the first gear 71 by the transmission shaft 9.

In the embodiment, the driving member 6 is a motor. In other embodiment, the driving member 6 may be other power source, such as a step motor.

In use, the glass substrate 10 is flatted on the supporting base 2 with two adjacent sides 11 of the glass substrate 10 near the pair of second positioning mechanisms 4, respectively. The driving member 6 drives the conveying belt 8 to rotate counterclockwise, the connecting bars 5 is driven to move together with the conveying belt 8. As a result, the supporting block 31 of the first positioning mechanism 3 slides along the corresponding slideways 20 and close to glass substrate 10. When the guiding wheels 33 of the first positioning mechanisms 3 contact the corresponding sides 11 of the glass substrate 10, the glass substrate 10 moves under a pushing force of the guiding wheels 33 of the first positioning mechanisms 3 to contact the pair of second positioning mechanisms 4. Because the glass substrate 10 is static relative to the glass substrate 10, the guiding wheels 33 of the first positioning mechanisms 3 and the second positioning mechanisms 4 collectively clamp the glass substrate 10 to position the glass substrate 10.

When the glass substrate 10 is required to be changed, the driving member 6 drives the conveying belt 8 to move clockwise, the connecting bars 5 are driven to be move together with the conveying belt 8. The supporting block 31 of the first positioning mechanism 3 moves along the corresponding slideways 20 and away from the glass substrate 10 to release the glass substrate 10. In this moment, the glass substrate 10 can be take out from the positioning device.

The positioning device of the present invention provides a gear group 7 driving the conveying belt 8 to move, and positions the glass substrate 10 accurately by coordination with the two pairs of positioning mechanisms 3, 4. As a result, in an automated production line of a LCD manufacturing facility, the glass substrate is positioned accurately by the positioning device before a special process that requires accuracy position of the glass substrate. As a result, the transmission error of the glass substrate is lowered, and the glass substrate is accurately transferred to a machine in the special process to be machined, which results improvement of a production yield of a TFT-LCD.

In addition, because the pair of second positioning mechanism 4 are static relative to the glass substrate 10, and the pair of first positioning mechanism 3 are capable of moving relative to the glass substrate 10, the positioning device can clamp and position various glass substrates with different sizes.

Furthermore, the structure of the positioning device is simple, in a low cost of purchase and maintain, and saving space of a cleanroom, which results of a low cost of LCD production.

What is claimed is:

1. A positioning device configured to position a glass substrate comprising two pairs of opposite sides, the positioning device comprising:
    a support base configured to support the glass substrate;
    a pair of first positioning mechanisms located on two neighboring sides of the glass substrate, respectively, and configured to move relative to the glass substrate;
    a pair of second positioning mechanisms located on another two neighboring sides of the glass substrate, respectively, and configured close to the glass substrate;
    a gear group comprising a first gear, a second gear and a third gear, and wherein the first gear, the second gear and the third gear are configured to be in a shape of a triangle;
    a conveying belt sleeved on the gear group;
    a pair of connecting bars, wherein one end of one of the pair of connecting bar is located between the second gear and the third gear and fixed with the conveying belt, and another end of the one of the pair of the connecting bar is fixed with one of the pair of first positioning mechanisms, and one end of another one of the pair of connecting bar is located between the third gear and the first gear and fixed with the conveying belt, and another end of the other one of the pair of the connecting bar is fixed with another one of the pair of first positioning mechanisms; and
    a driving member;
    wherein when the driving member drives the first gear to rotate clockwise, the conveying belt drives the pair of connecting bars to move together with the conveying belt, which results that the pair of first positioning mechanisms move away from the glass substrate to release the glass substrate;
    and wherein when the driving member drives the first gear to rotate counterclockwise, the conveying belt drives the pair of connecting bars to move together with the conveying belt, which results that the pair of first positioning mechanisms move close to the glass substrate, and the pair of first positioning mechanisms and the pair of second positioning mechanisms collectively clamp the glass substrate to position the glass substrate.

2. The positioning device according to claim 1, wherein the triangle is a right triangle, and the pair of connecting bars are located on two right-angle sides of the triangle, respectively.

3. The positioning device according to claim 2, wherein the pair of connecting bars are fixed with the conveying belt by connecting blocks.

4. The positioning device according to claim 2, wherein the two right-angle sides of the triangle are parallel to two adjacent sides of the glass substrate, respectively.

5. The positioning device according to claim 1, wherein each of the pair of first positioning mechanisms comprises a supporting block, at least one pole and at least one guiding wheel, and wherein one end of the pole is fixed with the supporting block, another end of the pole is fixed with the guiding wheel, and the at least one guiding wheel is configured for clamping the glass substrate.

6. The positioning device according to claim 5, wherein the material of the at least one guiding wheel is rubber.

7. The positioning device according to claim 5, wherein the positioning device further comprises two pairs of slideways, one pair of slideways corresponds to one of the pair of first positioning mechanisms, and wherein two ends of the supporting block are received in a corresponding pair of slideways, and moves along the slideways to release or clamp the glass substrate.

8. The positioning device according to claim 1, wherein the positioning device further comprises a transmission shaft, and the driving member is connected to the first gear by the transmission shaft.

9. The positioning device according to claim 8, wherein the driving member is a motor.

10. The positioning device according to claim 1, wherein the group of the gears is located under the supporting base.

11. A positioning device configured to position a glass substrate comprising two pairs of opposite sides, the positioning device comprising:
    a support base configured to support the glass substrate;
    a pair of first positioning mechanisms located on two neighboring sides of the glass substrate, respectively, and configured to move relative to the glass substrate;
    a pair of second positioning mechanisms located on another two neighboring sides of the glass substrate, respectively, and configured close to the glass substrate;
    a gear group;
    a convey belt sleeved on the gear group;
    a pair of connecting bars, wherein one end of one of the pair of connecting bar is fixed with the conveying belt, and another end of the one of the pair of the connecting bar is fixed with one of the pair of first positioning mechanisms, and one end of another one of the pair of connecting bar is fixed with the conveying belt, and another end of the other one of the pair of the connecting bar is fixed with another one of the pair of first positioning mechanisms; and
    a driving member;
    wherein when the driving member drives the gear group to rotate clockwise, the conveying belt drives the pair of connecting bars to move together with the conveying belt, which results that the pair of first positioning mechanisms move away from the glass substrate to release the glass substrate; and
    wherein when the driving member drives the gear group to rotate counterclockwise, the conveying belt drives the pair of connecting bars to move together with the conveying belt, which results that the pair of first positioning mechanisms move close to the glass substrate, and the pair of first positioning mechanisms and the pair of second positioning mechanisms collectively clamp the glass substrate to position the glass substrate.

12. The positioning device according to claim 11, wherein the gear group comprises a first gear, a second gear and a third gear, and the first, second and the third gears are configured in a shape of a triangle, and wherein one end of one of the pair of connecting bars is located between the second gear and the third gear, and one end of the other one of the pair of connecting bars is located between the third gear and the first gear.

13. The positioning device according to claim 12, wherein the positioning device further comprises a transmission shaft, and the driving member is connected to the gear group by the transmission shaft.

14. The positioning device according to claim 12, wherein the transmission shaft is connected with one item selected from the group consisting of the first gear, the second gear and the third gear.

15. The positioning device according to claim 12, wherein the triangle is a right triangle, and the pair of connecting bars are located on two right-angle sides of the triangle, respectively.

16. The positioning device according to claim 15, wherein the two right-angle sides of the triangle are parallel to two adjacent sides of the glass substrate, respectively.

17. The positioning device according to claim 15, wherein the pair of connecting bars are fixed with the conveying belt by connecting blocks.

18. The positioning device according to claim 11, wherein each of the pair of first positioning mechanisms comprises a supporting block, at least one pole and at least one guiding wheel, and wherein one end of the pole is fixed with the supporting block, another end of the pole is fixed with the guiding wheel, and the at least one guiding wheel is configured for clamping the glass substrate.

19. The positioning device according to claim 18, wherein the positioning device further comprises two pairs of slideways, one pair of slideways corresponds to one of the pair of first positioning mechanisms, and wherein two ends of the supporting block are received in a corresponding pair of slideways, and moves along the slideways to release or clamp the glass substrate.

20. The positioning device according to claim 11, wherein the group of the gears is located under the supporting base.

* * * * *